(12) United States Patent
LiCausi et al.

(10) Patent No.: US 8,691,640 B1
(45) Date of Patent: Apr. 8, 2014

(54) METHODS OF FORMING DIELECTRICALLY ISOLATED FINS FOR A FINFET SEMICONDUCTOR BY PERFORMING AN ETCHING PROCESS WHEREIN THE ETCH RATE IS MODIFIED VIA INCLUSION OF A DOPANT MATERIAL

(71) Applicant: GLOBALFOUNDRIES Inc., Grand Cayman (KY)

(72) Inventors: Nicholas V. LiCausi, Watervliet, NY (US); Jeremy A. Wahl, Delmar, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/745,927

(22) Filed: Jan. 21, 2013

(51) Int. Cl.
*H01L 21/00* (2006.01)
(52) U.S. Cl.
USPC .................. 438/156; 438/524; 257/E21.421

(58) Field of Classification Search
USPC ......... 438/156, 173, 192, 206, 209, 212, 268, 438/524
See application file for complete search history.

(56) References Cited

U.S. PATENT DOCUMENTS

| 6,790,751 B2 * | 9/2004 | Tsuruta et al. ................. 438/524 |
| 2008/0173937 A1 * | 7/2008 | Chung et al. ................... 257/329 |

* cited by examiner

*Primary Examiner* — Reema Patel
(74) *Attorney, Agent, or Firm* — Amerson Law Firm, PLLC (57) ABSTRACT

One illustrative method disclosed herein includes forming a plurality of trenches in a semiconductor substrate to thereby define an initial fin structure, forming sidewall spacers adjacent the initial fin structure, wherein the spacers cover a first portion of the initial fin structure and expose a second a portion of the initial fin structure, performing a doping process to form N-type doped regions in at least the exposed portion of the initial fin structure, and performing an etching process to remove at least a portion of the doped regions and thereby define a final fin structure that is vertically spaced apart from the substrate.

19 Claims, 10 Drawing Sheets

METHODS OF FORMING DIELECTRICALLY ISOLATED FINS FOR A FINFET SEMICONDUCTOR BY PERFORMING AN ETCHING PROCESS WHEREIN THE ETCH RATE IS MODIFIED VIA INCLUSION OF A DOPANT MATERIAL

BACKGROUND OF THE INVENTION

1. Field of the Invention

Generally, the present disclosure relates to the manufacture of sophisticated semiconductor devices, and, more specifically, to various methods of forming a FinFET semiconductor device using a novel etching process to form the fins for the device wherein the etch rate of the etching process is modified by inclusion of dopant materials.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a planar device that typically includes a source region, a drain region, a channel region that is positioned between the source region and the drain region, and a gate electrode positioned above the channel region. Current flow through the FET is controlled by controlling the voltage applied to the gate electrode. For example, for an NMOS device, if there is no voltage applied to the gate electrode, then there is no current flow through the NMOS device (ignoring undesirable leakage currents, which are relatively small). However, when an appropriate positive voltage is applied to the gate electrode, the channel region of the NMOS device becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, there are so-called 3D devices, such as an illustrative FinFET device, which is a three-dimensional structure. More specifically, in a FinFET, a generally vertically positioned fin-shaped active area is formed and a gate electrode encloses both sides and an upper surface of the fin-shaped active area to form a tri-gate structure so as to use a channel having a three-dimensional structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to reduce at least some short channel effects. When an appropriate voltage is applied to the gate electrode of a FinFET device, the surfaces (and the inner portion near the surface) of the fins, i.e., the substantially vertically oriented sidewalls and the top upper surface of the fin with inversion carriers, contributes to current conduction. In a FinFET device, the "channel-width" is approximately two times (2×) the vertical fin-height plus the width of the top surface of the fin, i.e., the fin width. Multiple fins can be formed in the same foot-print as that of a planar transistor device. Accordingly, for a given plot space (or foot-print), FinFETs tend to be able to generate significantly stronger drive current than planar transistor devices. Additionally, the leakage current of FinFET devices after the device is turned "OFF" is significantly reduced as compared to the leakage current of planar FETs due to the superior gate electrostatic control of the "fin" channel on FinFET devices. In short, the 3D structure of a FinFET device is a superior MOSFET structure as compared to that of a planar FET, especially in the 20 nm CMOS technology node and beyond. A further improvement upon FinFET devices involves the use of a dielectric isolation material to completely isolate the "fin" channel from one another and the substrate. The isolation material tends to reduce leakage between neighboring FinFET devices as well as decrease leakage current between the source and drain that travels through the substrate in a typical "bulk" FinFET device.

Figure 1A:
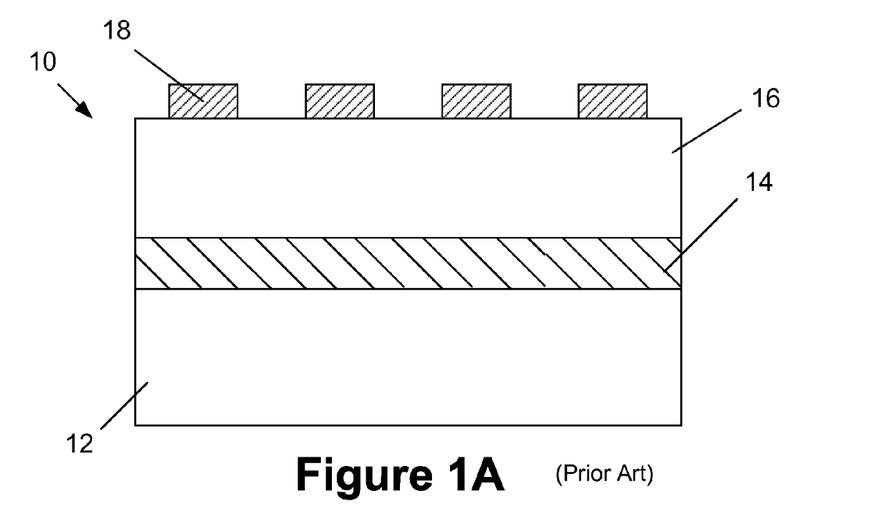
FIGS. 1A-1F depict an illustrative prior art method for forming fins for a FinFET semiconductor device.

FIGS. 1A-1F depict one illustrative prior art process flow for forming an illustrative FinFET semiconductor device 10 above a semiconductor substrate 12 comprised of, for example, silicon. FIG. 1A depicts the device 10 at a point of fabrication where an illustrative layer of silicon/germanium 14, a layer of silicon 16 and a patterned mask layer 18 have been formed for the device 10. The layer of silicon/germanium 14 and the layer of silicon 16 may be formed by performing known epitaxial growth processes. The masking layer 18 may be comprised of any of a variety of different materials, e.g., silicon nitride, and may be formed by depositing the layer(s) of material that comprise the masking layer 18 and thereafter directly patterning the masking layer 18 using known photolithography and etching techniques.

Figure 1B:
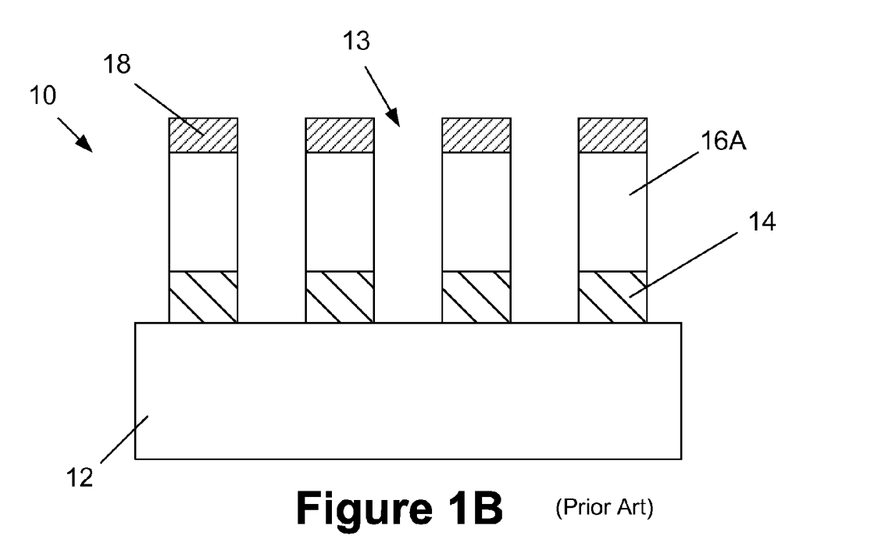

Next, as shown in FIG. 1B, one or more dry or wet etching processes is performed on the layers 16, 14 through the patterned mask layer 18 to form a plurality of trenches 13. In this example, the etching process stops on the substrate 12. This etching process results in the definition of a plurality of fin structures 16A that are each comprised of a portion of the layer of silicon 16.

Figure 1C:
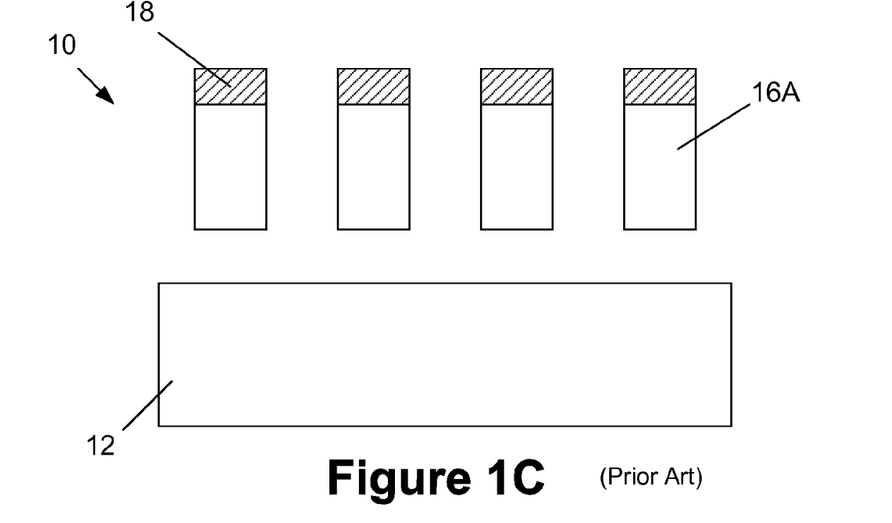
Figure 1D:
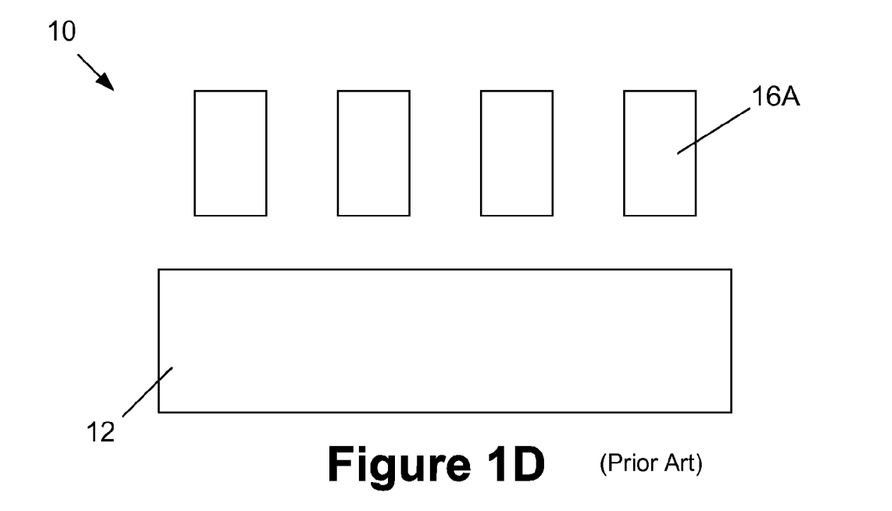
Figure 1E:
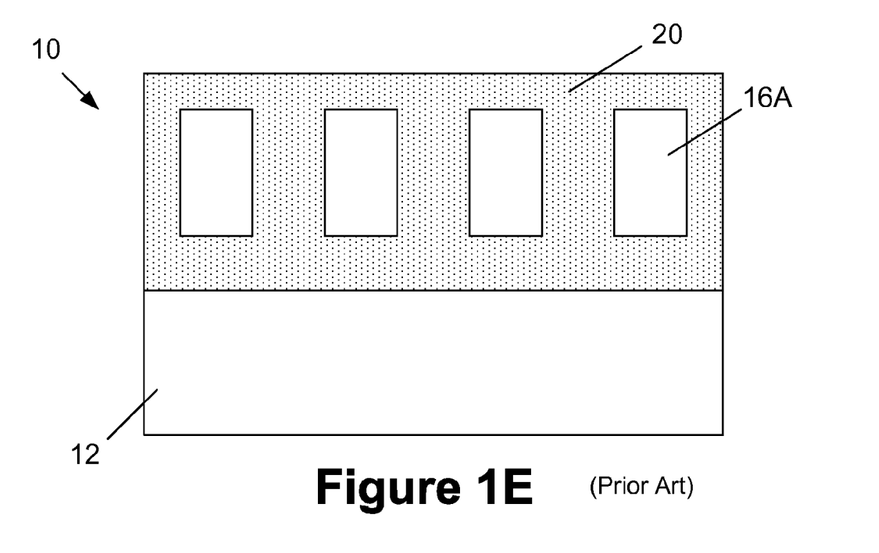
Figure 1F:
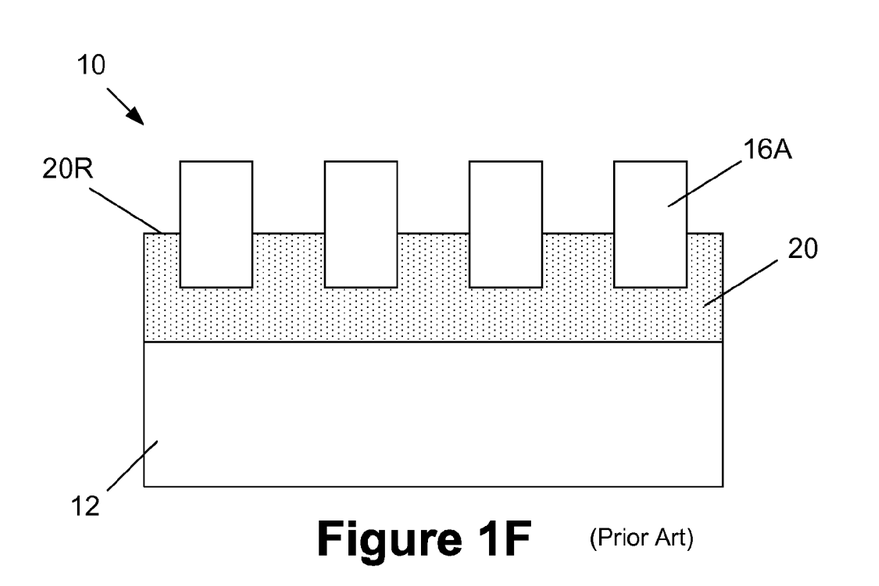

Then, as shown in FIG. 1C, another etching process is performed to selectively remove the patterned portions of the layer 14 relative to the surrounding materials. FIG. 1D depicts the device 10 after another etching process has been performed to remove the patterned mask layer 18 selectively relative to the surrounding materials. Then, as shown in FIG. 1E, a layer of insulating material 20 is formed on the device 10 so as to overfill the spaces between the fins 16A. The layer of insulating material 20 may be comprised of a variety of different materials, such as, for example, silicon dioxide, etc. Next, although not depicted in the drawings, in some cases, a chemical mechanical polishing (CMP) process may be performed to planarize the upper surface of the layer of insulating material 20 using the fins 16A as a polish-stop layer. FIG. 1F depicts the device 10 after an etching process was performed on the layer of insulating material 20 to reduce its thickness and thereby result in the layer of insulating material 20 having a recessed upper surface 20R. The recessed surface 20R of the layer of insulating material 20 defines the final fin height for fins 16A and isolates the device 10 from the substrate 12.

Another illustrative prior art process flow that is typically performed to form FinFET devices involves forming a plurality of trenches in the substrate to define the areas where STI regions will be formed and to define the initial structure of the fins. In some cases, the trenches are desirably designed with the same pitch (for better resolution during lithography) and they are formed to the same depth and width (for processing simplicity), wherein the depth of the trenches is sufficient for the needed fin height and deep enough to allow formation of an effective STI region. After the trenches are formed, a layer of insulating material, such as silicon dioxide, is formed so as to overfill the trenches. Thereafter, a chemical mechanical polishing (CMP) process is performed to planarize the upper surface of the insulating material with the top of the fins (or the top of a patterned hard mask). Thereafter, an etch-back process is performed to recess the layer of insulating material between the fins and thereby expose the upper portions of the fins, which corresponds to the final fin height of the fins.

Unfortunately, such a prior art process flow is not without drawbacks. First, the formation of the silicon/germanium materials by performing an epitaxial growth process is a costly and time-consuming process. Moreover, the formation of silicon/germanium materials on silicon can lead to undesirable defects in what will become the channel region of the FinFET device.

Device manufacturers are under constant pressure to produce integrated circuit products with increased performance and lower production costs relative to previous device generations. Thus, device designers spend a great amount of time and effort to maximize device performance while seeking ways to reduce manufacturing cost and improve manufacturing reliability. As it relates to 3D devices, device designers have spent many years and employed a variety of techniques in an effort to improve the performance capability and reliability of such devices.

The present disclosure is directed to various methods of forming a dielectrically isolated FinFET semiconductor device using a novel etching process to form the fins for the device and to isolate the fins from the substrate and from one another, wherein the etch rate of the etching process is modified by inclusion of dopant materials.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming a dielectrically isolated FinFET semiconductor device using a novel etching process to form the fins for the device wherein the etch rate of the etching process is modified by inclusion of dopant materials. One illustrative method disclosed herein includes forming a plurality of trenches in a semiconductor substrate to thereby define an initial fin structure, forming sidewall spacers adjacent the initial fin structure, wherein the spacers cover a first portion of the initial fin structure and expose a second a portion of the initial fin structure, performing a doping process to form N-type doped regions in at least the exposed portion of the initial fin structure, and performing an etching process to remove at least a portion of the doped regions and thereby define a final fin structure that is vertically separated from the substrate.

Another illustrative method involves forming a plurality of trenches in a semiconductor substrate to thereby define an initial fin structure, forming sidewall spacers adjacent the initial fin structure, wherein the spacers cover a first portion of the initial fin structure and expose a second a portion of the initial fin structure, performing a plasma doping process to form N-type doped regions in the exposed portion of the initial fin structure and in a bottom of the trenches, wherein the doped regions have a dopant concentration of N-type dopant material that falls within the range of about $10^{19}$-$10^{21}$ atoms/cm$^3$, and performing an etching process to remove at least a portion of the doped regions and thereby define a final fin structure that is vertically spaced apart from the substrate.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming a dielectrically isolated FinFET semiconductor device using a novel etching process to form the fins for the device wherein the etch rate of the etching process is modified by inclusion of dopant materials. As will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. With reference to the attached figures, various illustrative embodiments of the methods and devices disclosed herein will now be described in more detail.

FIGS. 2A-2M depict various illustrative embodiments of a novel dielectrically isolated FinFET semiconductor device 100 disclosed herein, and various methods of making the dielectrically isolated FinFET device 100. The device 100 may be either an N-type device or a P-type device, and its gate structure may be formed using either so-called "gate-first" or "replacement gate" ("gate-last") techniques. In the attached drawings, the device 100 is depicted as being formed above a semiconductor substrate 102 comprised of a first semiconductor material, such as, for example, silicon. The illustrative substrate 102 may be a bulk semiconductor substrate. Thus, the terms "substrate," "semiconductor substrate" or "semiconducting substrate" should be understood to cover all semiconductor materials and all forms of such semiconductor materials. A trench isolation structure (not shown) may be formed in the substrate 102 to define an active region where the device 100 will be formed. Of course, as will be recognized by those skilled in the art after a complete reading of the present application, the isolation structure may be formed before or after various fins (described below) are formed for the device 100.

Figure 2A:
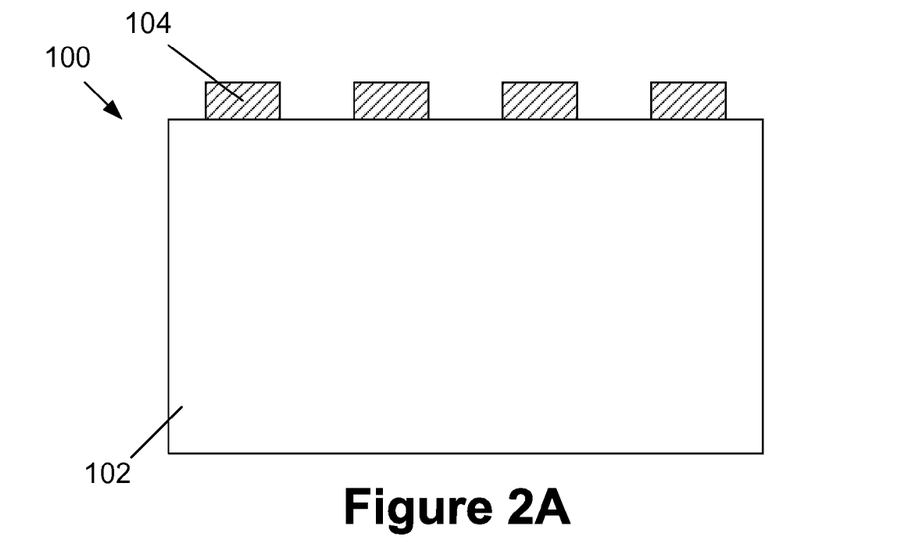
FIGS. 2A-2M depict various novel methods to form the fins for a dielectrically isolated FinFET device, wherein the etch rate of an etching process that is used in forming the fins is modified by inclusion of dopant materials.

At the point of fabrication depicted in FIG. 2A, a patterned mask layer 104 has been formed above the substrate 102. In one embodiment, the patterned mask layer 104 may be a patterned hard mask layer and it may be formed using known deposition, photolithography and etching techniques. The patterned mask layer 104 is intended to be representative in nature as it could be comprised of a variety of materials, such as, for example, a photoresist material, silicon nitride, silicon oxynitride, silicon dioxide, etc. Moreover, the patterned mask layer 104 could be comprised of multiple layers of material, such as, for example, a pad oxide layer (not shown) that is formed on the substrate 102 and a pad nitride layer (not shown) that is formed on the pad oxide layer. Thus, the particular form and composition of the patterned mask layer 104 and the manner in which it is made should not be considered a limitation of the presently disclosed inventions. In the case where the patterned mask layer 104 is comprised of one or more hard mask layers, such layers may be formed by performing a variety of known processing techniques, such as a chemical vapor deposition (CVD) process, an atomic layer deposition (ALD) process, an epitaxial deposition process (EPI), or plasma enhanced versions of such processes, and the thickness of such a layer(s) may vary depending upon the particular application. In one illustrative embodiment, the patterned mask layer 104 is a hard mask layer of silicon nitride that is initially formed by performing a CVD process to deposit a layer of silicon nitride and thereafter patterning the layer of silicon nitride using known sidewall image transfer techniques and/or photolithographic techniques combined with performing known etching techniques.

Figure 2B:
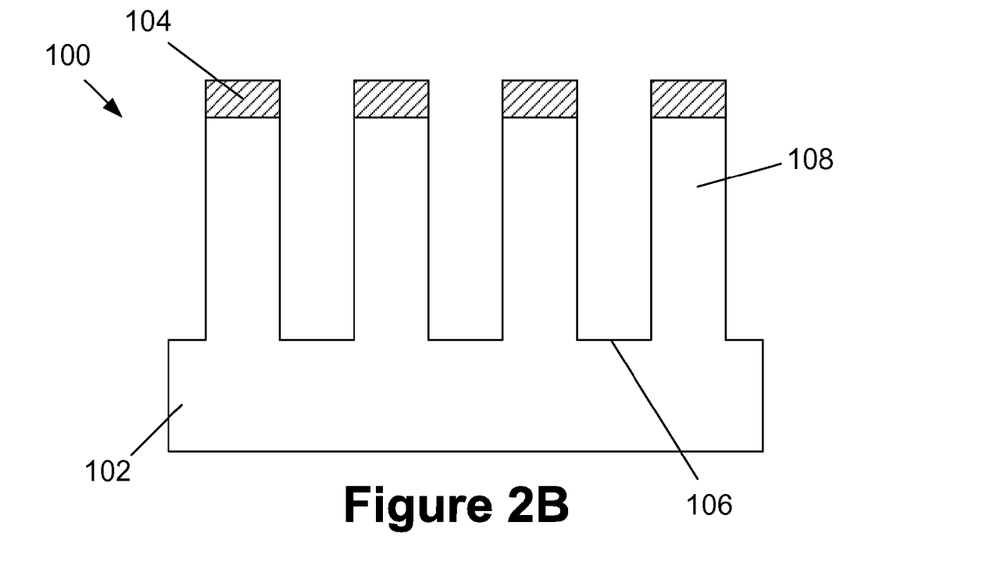

Next, as shown in FIG. 2B, one or more dry or wet etching processes is performed on the substrate 102 through the patterned mask layer 104 to form a plurality of trenches 106. The trenches 106 define a plurality of initial fin structures 108 that are each comprised of a portion of the substrate 102. The overall size, shape and configuration of the trenches 106 and the initial fin structures 108 may vary depending on the particular application. The depth and width of the trenches 106 as well as the height and width of the initial fin structures 108 may vary depending upon the particular application. In one illustrative embodiment, based on current day technology, the width of the trenches 106 may range from about 8-30 nm. In some embodiments, the initial fin structures 108 may have a width within the range of about 5-20 nm. The initial fin structures 108 may be formed to any desired pitch. In the illustrative example depicted in the attached figures, the trenches 106 and the initial fin structures 108 are all depicted as having a uniform size and shape. However, such uniformity in the size and shape of the trenches 106 and the initial fin structures 108 may not be required to practice at least some aspects of the inventions disclosed herein. In the example disclosed herein, the trenches 106 are depicted as having been formed by performing an anisotropic etching process that results in the trenches 106 having a schematically depicted, generally rectangular configuration with substantially vertical sidewalls. In an actual real-world device, the sidewalls of the trenches 106 may be somewhat tapered, although that configuration is not depicted in the drawings. To the extent the trenches 106 are formed by performing a wet etching process, the trenches 106 may tend to have a more rounded configuration or non-linear configuration as compared to the generally rectangular configuration of the trenches 106 that are formed by performing an anisotropic etching process. Thus, the size and configuration of the trenches 106, and the manner in which they are made, should not be considered a limitation of the presently disclosed inventions. For ease of disclosure, only the substantially rectangular trenches 106 will be depicted in subsequent drawings.

Figure 2C:
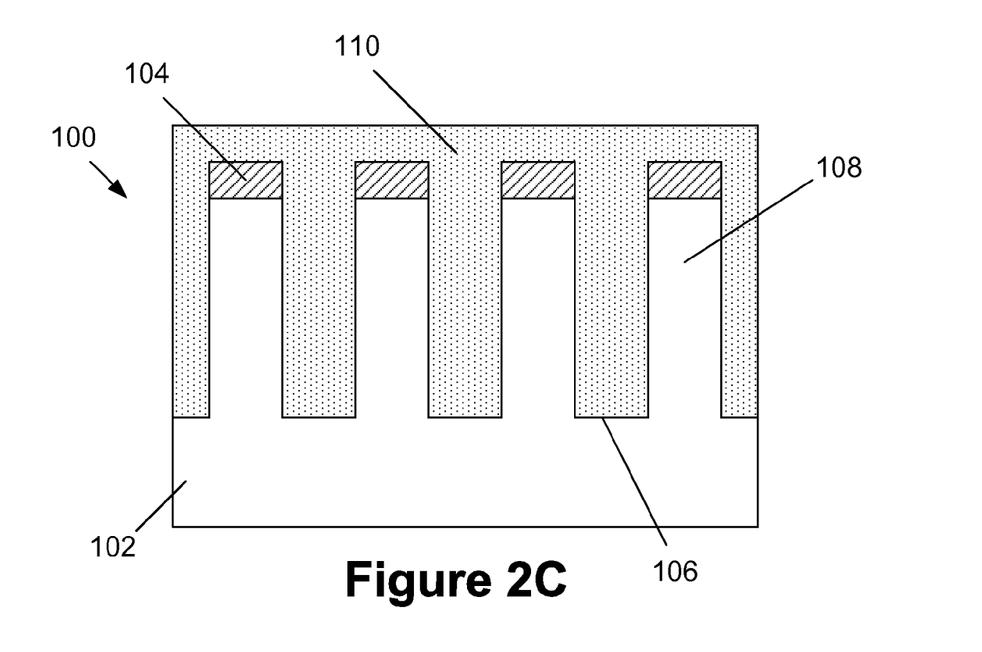

FIG. 2C depicts the device 100 after a sacrificial layer of insulating material 110 was formed on the device 100 so as to overfill the trenches 106. The sacrificial layer of insulating material 110 may be comprised of a variety of different materials, such as, for example, silicon dioxide, organic planarizing material, amorphous carbon, silicon oxynitride, silicon nitride, etc., or multiple layers thereof, etc., and it may be formed by performing a variety of techniques, e.g., CVD, etc. If desired, an optional chemical mechanical polishing (CMP) process may be performed to planarize the upper surface of the layer of insulating material 110 using the patterned mask layer 104 as a polish-stop layer. After such a CMP process, the upper surface of the sacrificial layer of insulating material 110 is substantially level with the upper surface of the patterned mask layer 104.

Figure 2D:
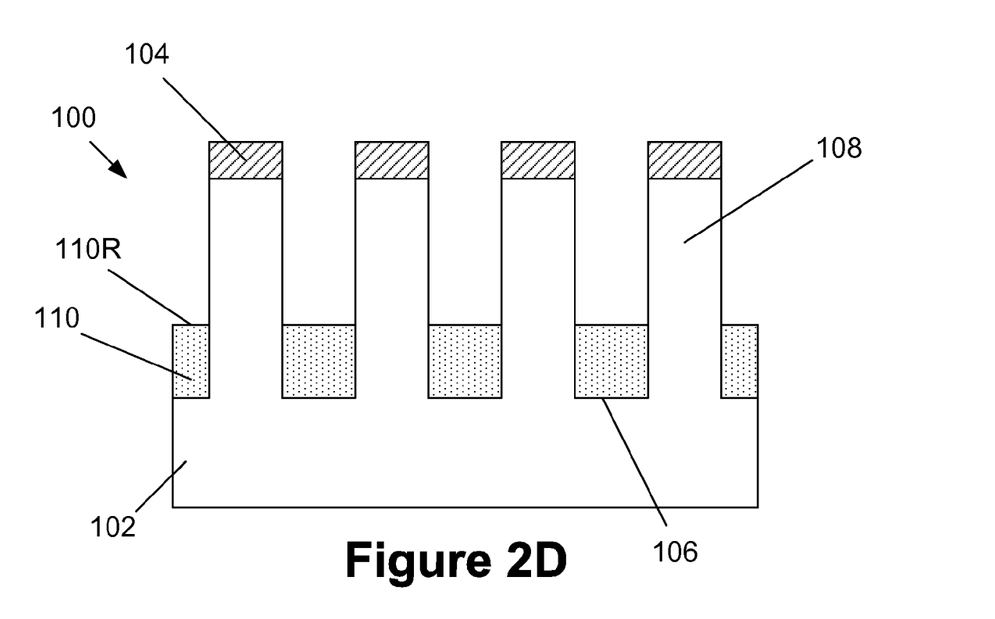

FIG. 2D depicts the device 100 after an etching process was performed on the sacrificial layer of insulating material 110 to reduce its thickness and thereby result in the layer of insulating material having a recessed upper surface 110R. The recessed surface 110R of the layer of insulating material 110 exposes a portion of the initial fin structures 108 for further processing. The amount or height of the initial fin structures 108 exposed in this process may vary depending upon the particular application.

Figure 2E:
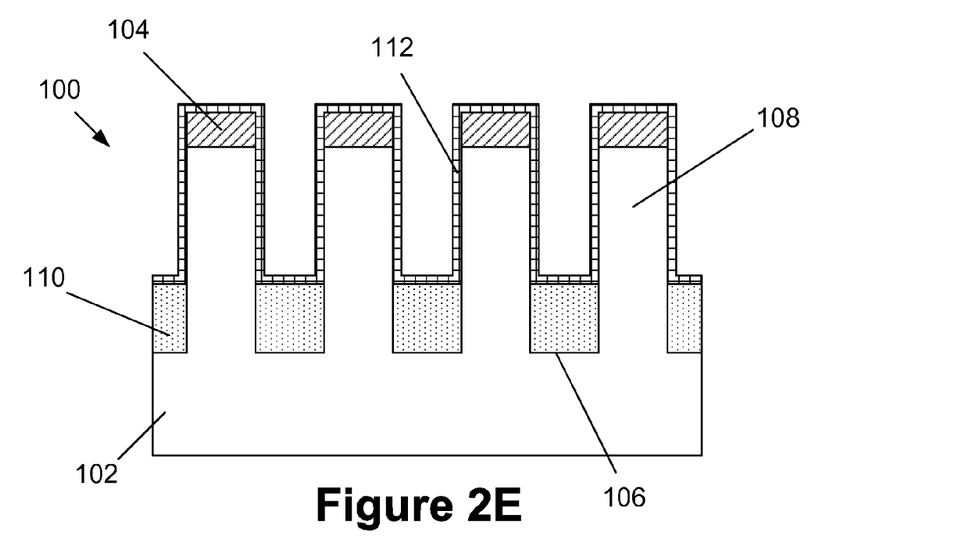

FIG. 2E depicts the device 100 after a conformal deposition process, e.g., a conformal ALD process, has been performed to form a layer of insulating material 112, e.g., silicon nitride, silicon dioxide, silicon oxynitride, a high-k insulating material (k value of 7 or greater), etc., on the device 100. In one embodiment, the layer of insulating material 112 is formed to a thickness of about 3-5 nm.

Figure 2F:
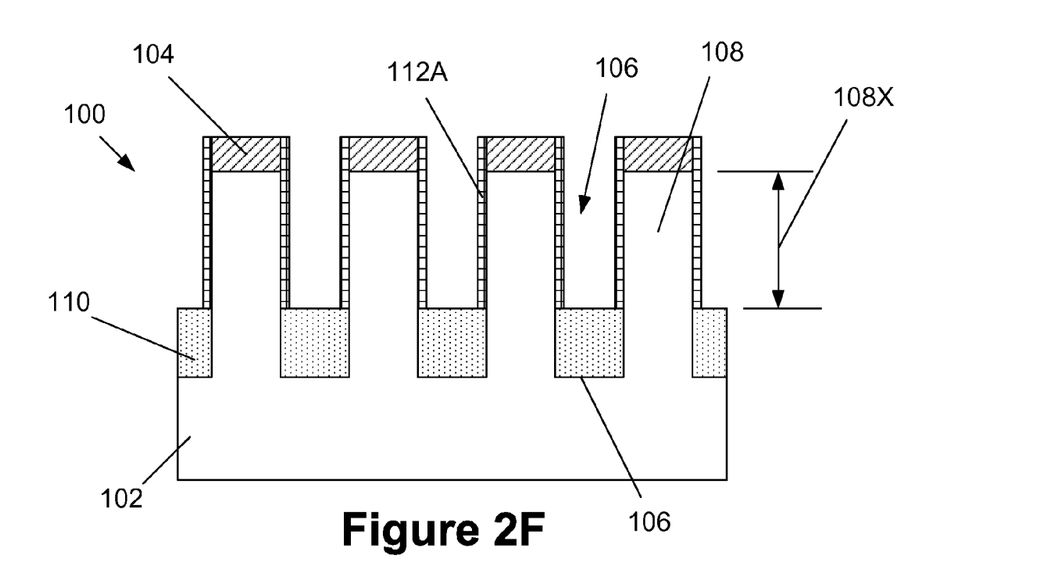

Next, as shown in FIG. 2F, an anisotropic etching process is performed on the layer of insulating material 112 to thereby define sidewall spacers 112A on the sidewalls of the initial fin structures 108. The spacers 112A cover a first portion 108X of the sidewalls of the initial fin structure 108. This etching process also clears the layer of insulating material 112 from above the layer of insulating material 110 in the bottom of the trenches 106.

Figure 2G:
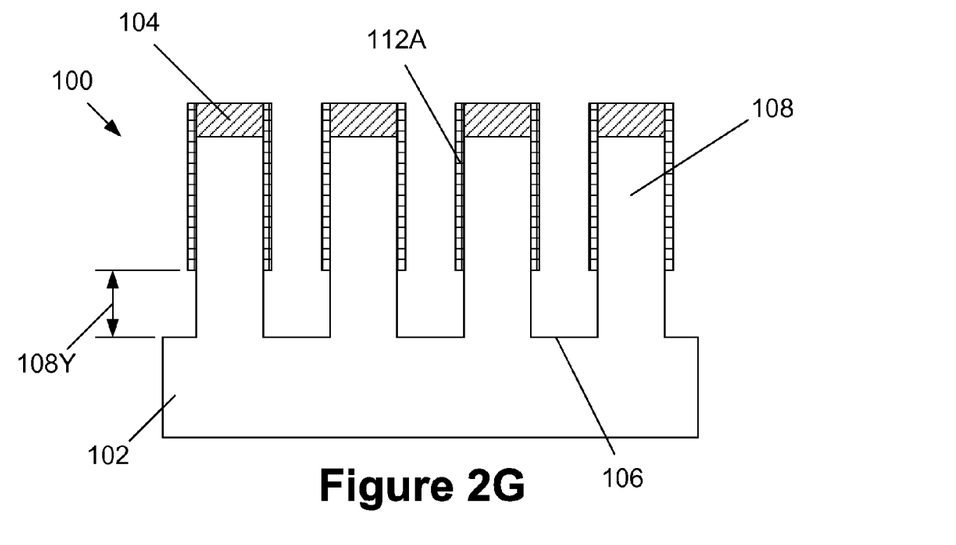

Next, as shown in FIG. 2G, an etching process, such as a wet isotropic etching process, is performed to remove the remaining portions of the sacrificial layer of insulating material 110 selectively relative to the surrounding materials. This process operation results in the exposure of lower second portions 108Y of the initial fin structures 108 and the bottom of the trenches 106 for further processing.

Figure 2H:
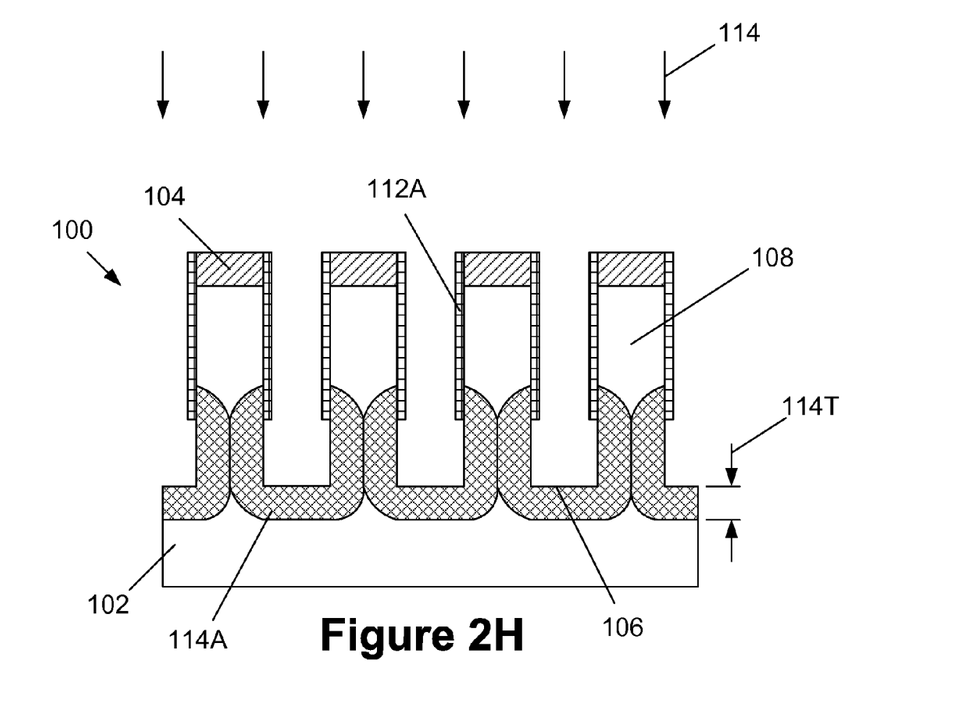

Then, as shown in FIG. 2H, a doping process 114, such as a plasma doping process, is performed to form doped regions 114A in at least the exposed portions of the substrate 102 at the bottom of the trenches 106 and the exposed portions 108Y of the initial fin structures 108. In one particular example, the doping process 114 may be a plasma doping process that is followed by a drive-in heat treatment process, although the dopant drive-in process may not be required in all applications. In one illustrative example, the dopant drive-in heat treatment process may be a rapid thermal anneal (RTA) process performed at a temperature that falls within the range of about 600-1100° C. for a duration that falls within the range of about 0.25 milliseconds—30 seconds. In general, the doping process 114 will be performed with an N-type dopant material, such as phosphorous, arsenic, antimony, etc., and the doped regions 114A will have a dopant concentration of N-type dopant material that falls within the range of about $10^{19}$-$10^{21}$ atoms/cm$^3$. In one particular example, the doping process 114 may be a plasma doping process wherein phosphine is combined with a carrier gas and the doped regions 114A have a dopant concentration of about $10^{19}$-$10^{21}$ atoms/cm$^3$. The thickness 114T of the doped regions 114A may vary depending upon the particular application. In one illustrative embodiment, the thickness 114T may be about one-half the width or thickness of the initial fin structures 108. In general, the doped regions 114A contain a relatively higher concentration of N-type dopant materials than do the adjacent portions of the substrate 102 and the initial fin structures 108, which may, in some cases, be undoped, doped with a P-type dopant or a lesser concentration of N-type dopant material.

Figure 2I:
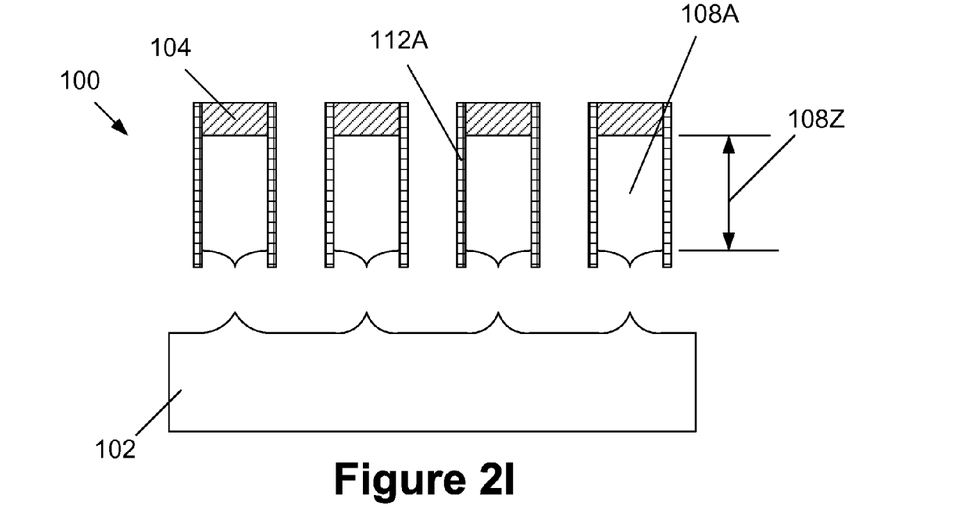

FIG. 2I depicts the device 100 after an etching process, such as a wet or dry etching process, is performed to selectively remove the doped regions 114A relative to the surrounding structures. Due to the presence of the dopant material, the doped regions 114A will etch at a faster rate than the portions of the substrate 102 and the initial fin structures 108 that are not part of the doped regions 114A. This process effectively consumes the lower portions 108Y of the initial fin structures 108 and thereby defines final fin structures 108A for the device 100 that are vertically separated from the underlying substrate 102. The final fin structures 108A have a height 108Z that is less than the height of the initial fin structures 108. In one illustrative example, the etching process may be a dry, chlorine-based etching process. Due to the presence of the doped regions 114A, the etching process is essentially self-limiting in nature, as the difference in etch rates between the doped regions 114A and the surrounding structures can be relatively high, e.g., depending upon the dopant levels on the order of about 3:1-300:1, depending upon the relative concentrations of dopant material in the doped regions 114A, the dopant concentration in the surrounding materials and the materials used to construct the device 100. The ends of the final fin structures 108A are anchored to portions of the substrate 102 that are not depicted in the plane of the drawing figures. In some cases, the final fin structures 108A may be formed prior to the formation of a trench isolation region around the device 100.

Figure 2J:
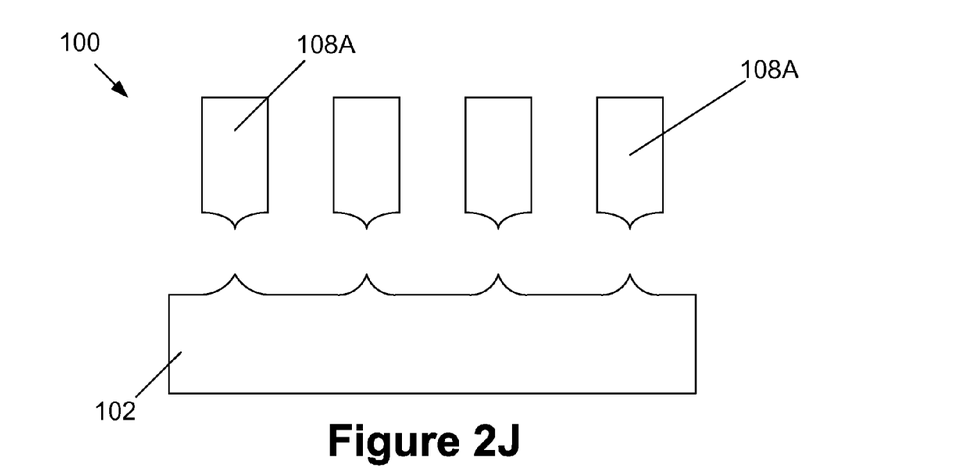

Next, as shown in FIG. 2J, one or more etching processes, such as wet and/or dry etching processes, have been performed to remove the patterned mask layer 104 and the sidewall spacers 112A selectively relative to the surrounding materials.

Figure 2K:
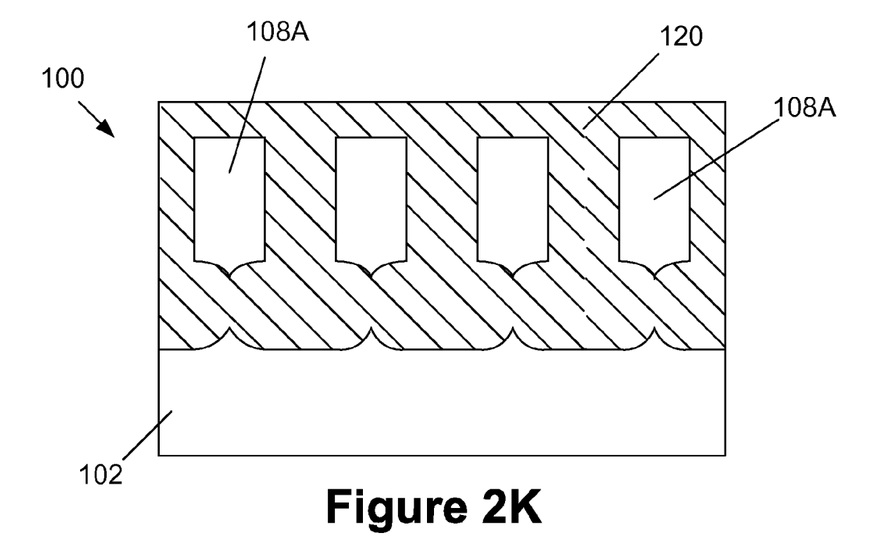

FIG. 2K depicts the device 100 after a layer of insulating material 120 was formed on the device 100 so as to overfill the areas between the final fin structures 108A. As described more fully below, portions of the layer of insulating material 120 will serve as isolation material on the final FinFET device 100. The layer of insulating material 120 may be comprised of a variety of different materials, such as, for example, silicon dioxide, a low-k insulating material (k value less than about 3.3), SiCOH, etc. or multiple layers thereof, etc., and it may be formed by performing a variety of techniques, e.g., CVD, etc. If desired, at the point of fabrication depicted in FIG. 2K, an optional chemical mechanical polishing (CMP) process may be performed to planarize the upper surface of the layer of insulating material 120 using the final fin structures 108A as a polish-stop. After such a CMP process, the upper surface of the layer of insulating material 120 is substantially level with the upper surface of the final fin structures 108A.

Figure 2L:
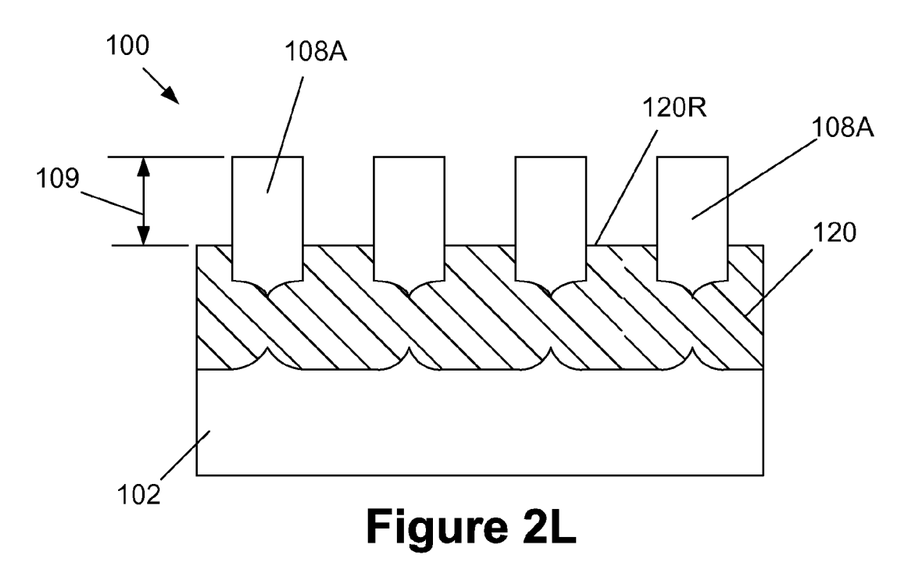

FIG. 2L depicts the device 100 after an etching process was performed on the layer of insulating material 120 to reduce its thickness and thereby result in the layer of insulating material 120 having a recessed upper surface 120R. The recessed surface 120R of the layer of insulating material 120 exposes the final fin structures 108A to their final fin height 109, the magnitude of which may vary depending upon the particular application, e.g., 10-50 nm.

Figure 2M:
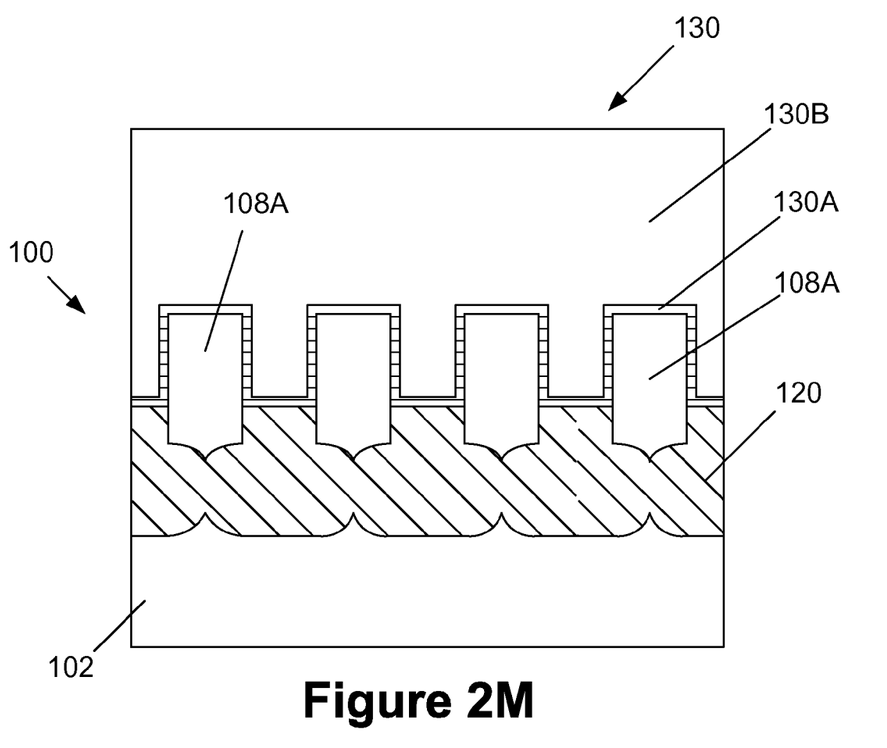

Next, as shown in FIG. 2M, a final gate structure 130 is formed on the device 100 using any of a variety of well-known techniques. The device 100 may be either an N-type device or a P-type device, and the gate structure 130 for the device 100 may be formed using either so-called "gate-first" or "replacement gate" ("gate-last") techniques. In one illustrative embodiment, the schematically depicted gate structure 130 includes an illustrative gate insulation layer 130A and an illustrative gate electrode 130B. An illustrative gate cap layer (not shown) may also be formed above the illustrative gate electrode 130B. The gate insulation layer 130A may be comprised of a variety of different materials, such as, for example, silicon dioxide, a so-called high-k (k greater than 7) insulation material (where k is the relative dielectric constant), etc. The thickness of the gate insulation layer 130A may also vary depending upon the particular application, e.g., it may have a thickness of about 0.5-4 nm. Similarly, the gate electrode 130B may also be comprised of a variety of conductive materials, such as polysilicon or amorphous silicon, or it may be comprised of one or more metal layers that act as the gate electrode 130B. As will be recognized by those skilled in the art after a complete reading of the present application, the gate structure 130 of the device 100 depicted in the drawings, i.e., the gate insulation layer 130A and the gate electrode 130B, is intended to be representative in nature. That is, the gate structure 130 may be comprised of a variety of different materials and it may have a variety of configurations. In one illustrative embodiment, a thermal oxidation process may be performed to form a gate insulation layer 130A comprised of a silicon dioxide. Thereafter, the gate electrode material 130B and the gate cap layer material (not shown) may be deposited above the device 100 and the layers may be patterned using known photolithographic and etching techniques. In another illustrative embodiment, a conformal CVD or ALD process may be performed to form a gate insulation layer 130A comprised of hafnium oxide. Thereafter, one or more metal layers (that will become the gate electrode 130B) and a gate cap layer material (not shown), e.g., silicon nitride, may be deposited above the device 100.

At this point, traditional manufacturing techniques may be performed to complete the manufacture of the device 100. For example, a sidewall spacer (not shown) comprised of, for example, silicon nitride, may be formed adjacent the final gate structure 130. After the spacer is formed, if desired, an epitaxial growth process may be performed to form additional semiconducting material (not shown) on the portions of the final fin structures 108A positioned outside of the spacer. Additional contacts and metallization layers may then be formed above the device 100 using traditional techniques.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a device, comprising:
    forming a plurality of trenches in a semiconductor substrate to thereby define an initial fin structure;
    forming sidewall spacers adjacent said initial fin structure, said sidewall spacers covering a first portion of said initial fin structure and exposing a second a portion of said initial fin structure;
    performing a doping process to form N-type doped regions in at least said exposed portion of said initial fin structure; and
    performing an etching process to remove at least a portion of said doped regions and thereby define a final fin structure that is vertically spaced apart from said substrate.

2. The method of claim 1, further comprising:
    removing said sidewall spacers;
    forming a layer of insulating material above and around said final fin structure;
    recessing a surface of said layer of insulating material to thereby expose a final fin height of said final fin structure; and
    after recessing said surface of said layer of insulating material, forming a gate structure around at least a portion of said final fin structure.

3. The method of claim 2, wherein said gate structure comprises a gate insulation layer comprised of a high-k insulating material and a gate electrode comprised of at least one layer of metal.

4. The method of claim 2, wherein said gate structure comprises a gate insulation layer comprised of an oxide and a gate electrode comprised of polysilicon.

5. The method of claim 1, wherein performing said doping process comprises performing a plasma doping process.

6. The method of claim 1, wherein said doped regions have a dopant concentration of N-type dopant material that falls within the range of about $10^{19}$-$10^{21}$ atoms/cm$^3$.

7. The method of claim 1, further comprising, after performing said doping process, performing a heat treatment process.

8. The method of claim 1, wherein performing said etching process comprises performing a chlorine-based etching process.

9. A method of forming a device, comprising:
    forming a plurality of trenches in a semiconductor substrate to thereby define an initial fin structure;
    forming sidewall spacers adjacent said initial fin structure, said sidewall spacers covering a first portion of said initial fin structure and exposing a second portion of said initial fin structure;
    performing a plasma doping process to form N-type doped regions in said exposed portion of said initial fin structure and in a bottom of said trenches, wherein said doped regions have a dopant concentration of N-type dopant material that falls within the range of about $10^{19}$-$10^{21}$ atoms/cm$^3$; and
    performing an etching process to remove at least a portion of said doped regions and thereby define a final fin structure that is vertically spaced apart from said substrate.

10. The method of claim 9, further comprising:
    removing said sidewall spacers;
    forming a layer of insulating material above and around said final fin structure;
    recessing a surface of said layer of insulating material to thereby expose a final fin height of said final fin structure; and
    after recessing said surface of said layer of insulating material, forming a gate structure around at least a portion of said final fin structure.

11. The method of claim 9, further comprising, after performing said plasma doping process, performing a rapid thermal anneal process.

12. The method of claim 9, wherein performing said etching process comprises performing a chlorine-based etching process.

13. A method of forming a device, comprising:
    forming a patterned mask layer above a semiconducting substrate;
    performing an etching process through said patterned mask layer to form a plurality of trenches in a semiconductor substrate that define an initial fin structure having sidewalls, wherein a portion of said hard mask layer is positioned above said initial fin structure;
    forming a sacrificial first layer of insulating material in said trenches and above said patterned mask layer;
    recessing a surface of said sacrificial first layer of insulating material to thereby expose a first portion of said sidewalls of said initial fin structure;
    forming sidewall spacers on said exposed first portion of said sidewalls of said initial fin structure;
    removing said sacrificial first layer of insulating material to thereby expose a second portion of said initial fin structure;
    forming N-type doped regions in said exposed second portion of said initial fin structure; and performing an etching process to remove at least a portion of said doped regions and thereby define a final fin structure that is vertically spaced apart from said substrate.

14. The method of claim 13, further comprising:

performing at least one etching process to remove said portion of said patterned mask layer positioned above said initial fin structure and said sidewall spacers;

forming a second layer of insulating material above and around said final fin structure;

recessing a surface of said second layer of insulating material to thereby expose a final fin height of said final fin structure; and after recessing said surface of said second layer of insulating material, forming a gate structure around at least a portion of said final fin structure.

15. The method of claim 13, wherein said semiconducting substrate is a bulk silicon substrate.

16. The method of claim 13, wherein performing said doping process comprises performing a plasma doping process.

17. The method of claim 13, wherein said doped regions have a dopant concentration of N-type dopant material that falls within the range of about $10^{19}$-$10^{21}$ atoms/cm$^3$.

18. The method of claim 13, further comprising, after performing said doping process, performing a heat treatment process.

19. The method of claim 13, wherein performing said etching process comprises performing a chlorine-based etching process.

* * * * *